United States Patent [19]

Ogura et al.

[11] Patent Number: 4,914,479
[45] Date of Patent: Apr. 3, 1990

[54] IMAGE FORMATION APPARATUS WITH CARTRIDGE FOR ROLL OF PHOTOSENSITIVE SHEET

[75] Inventors: Mitsuru Ogura; Shougo Iwai, both of Nara, Japan

[73] Assignee: Sharp Kabushiki Kaisha, Osaka, Japan

[21] Appl. No.: 228,580

[22] Filed: Jul. 27, 1988

[30] Foreign Application Priority Data

Aug. 11, 1987 [JP] Japan .................................. 62-201503
Aug. 11, 1987 [JP] Japan .................................. 62-201504
Aug. 11, 1987 [JP] Japan .................................. 62-201505
Aug. 12, 1987 [JP] Japan .................................. 62-202447
Aug. 12, 1987 [JP] Japan .................................. 62-202448

[51] Int. Cl.⁴ .......................................... G03G 15/00
[52] U.S. Cl. ...................................... 355/213; 355/72
[58] Field of Search .............. 355/213, 210, 211, 212, 355/72, 74

[56] References Cited

U.S. PATENT DOCUMENTS

3,829,208  8/1974  Van Meijel et al. ................. 355/213
4,063,809  12/1977  Schrempp et al. ................... 355/213
4,685,638  8/1987  Satoyoshi et al. ............... 355/212 X
4,707,704  11/1987  Allen et al. ...................... 355/213 X Primary Examiner—A. C. Prescott
Attorney, Agent, or Firm—Flehr, Hohbach, Test, Albritton & Herbert

[57] ABSTRACT

A cartridge containing a roll of photosensitive sheet and set inside an image formation apparatus has both an outlet and an inlet. Its interior is divided by a flexible sheet into a chamber originally containing the roll of unused photosensitive sheet and another chamber into which used portion of the sheet is collected through the inlet. A roller near the outlet for contacting the photosensitive sheet to thereby pull it out of the cartridge operates only for a specified length of time or until a specified length of an uncoated leading section of the photosensitive sheet is pulled out and thereafter the roller is removed from the contacting position with the photosensitive sheet so as not to contact and damage the microcapsule-coated part of the photosensitive sheet which follows the leading section.

20 Claims, 8 Drawing Sheets

IMAGE FORMATION APPARATUS WITH CARTRIDGE FOR ROLL OF PHOTOSENSITIVE SHEET

BACKGROUND OF THE INVENTION

This invention relates to an image formation apparatus with a cartridge for housing a roll of photosensitive sheet.

Of particular interest for application of this invention are photosensitive sheets of the type disclosed, for example, in Japanese Patent Publication Tokkai No. 58-88739 comprised of a flexible base sheet coated with microcapsules encapsulating a colorless dye and a photopolymerizing agent which hardens by exposure to light. When a photosensitive sheet like this is exposed to an image forming beam of light such as reflected light from an original document to be copied, those of the microcapsules exposed to light harden while those not exposed remain soft such that an invisible image, or a pattern, of selectively hardened microcapsules is formed on the sheet. A visible image can be obtained from such an invisible image by superposingly covering the invisible pattern with an image transfer sheet coated with a developer material and pressing them together such that only those of the microcapsules which are not hardened by exposure to light are ruptured, causing the encapsulated colorless dye to flow out. The developer material is so selected as to have a chromogenic effect on the dye encapsulated in the microcapsules. Thus, the dye flowing out of the ruptured microcapsules becomes visible, producing a visible image on the transfer sheet.

In an image formation process of this type, it is important to protect the surface of the photosensitive sheet coated with microcapsules not only against external light but also against external force before it is exposed to the image forming beam of light because an external force may rupture the microcapsules. One method of achieving this is to prepare the photosensitive sheet in the form of a roll and set it inside the housing structure of the image formation apparatus. An additional advantage of preparing the photosensitive sheet in a rolled form is that it can then be directly wound around a cylindrical drum on the surface of which an exposure point is defined by an optical system. In this manner, the photosensitive sheet can be supplied and transported by the rotation of this drum and feeding rollers and the like for transporting cut sheets from a cassette can be dispensed with. In other words, the coated surface of the photosensitive sheet can be protected against frictional force of these rollers. If the sheet is rolled up and set inside the housing structure, furthermore, it can also be safely protected against exposure to external light.

A rolled photosensitive sheet, however, risks the danger of exposure to light before it is set inside the housing structure of the image formation apparatus. Moreover, a roll of photosensitive sheet to be directly set inside the image formation apparatus is not easy to work with. Thus, there have been ideas of providing a detachably attachable cartridge inside an image formation apparatus for supporting such a roll of photosensitive sheet. A trouble with such an idea is that the cartridge must be so structured that a front edge of the rolled sheet stored inside can be easily pulled outside. When such a cartridge is set inside an image formation apparatus, the user must pull out the front edge of the sheet somehow and wrap it around the drum, etc. This, too, is a cumbersome job.

With a cartridge of a simple type intended only for an unused roll of photosensitive sheet, furthermore, there must be provided an additional space somewhere inside the housing structure of the image formation apparatus for storing the used part of the sheet. If the photosensitive sheet comprises a film of 25 $\mu$m in thickness and is capable of copying 1000 images of size A4 in its longitudinal direction, the external diameter of its roll becomes about 120 mm. Not only is a cartridge larger than this size necessary but an extra space of comparable size must also be provided inside the housing structure for the used sheet.

SUMMARY OF THE INVENTION

It is therefore an object of the present invention to provide an image formation apparatus with a cartridge for storing therein a roll of photosensitive sheet from which the front edge of the sheet stored therein can be automatically pulled out after the cartridge is set inside the housing structure of the image formation apparatus.

It is another object of the present invention to provide an image formation apparatus as described above which does not require a large additional space for storing used part of the photosensitive sheet.

It is a further object of the present invention to provide an image formation apparatus with a cartridge as described above which does not damage the coated surface of the photosensitive sheet as it is pulled out.

The above and other objects of the present invention are achieved by providing a cartridge having both an outlet and an inlet formed on its housing for the photosensitive sheet contained therein to pass through to go out and to be led in, respectively. The interior of the cartridge is separated by a flexible screen into a chamber containing the roll of photosensitive sheet initially and another chamber into which used portion is collected. In the beginning, a relatively stiff leading section at the front end of the photosensitive sheet is at the outlet. A delivery roller disposed near the outlet is then contacted to this leading section and pulls the photosensitive sheet out of the cartridge. After a predetermined length of the leading section of the photosensitive sheet has been pulled out or after the delivery roller is operated for a predetermined length of time, the delivery roller is removed from the surface of the photosensitive sheet so as not to contact the microcapsule-coated part of the photosensitive sheet. The motion of the photosensitive sheet is thereafter controlled by a main drum and a roller for applying pressure on its surface.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

In all these figures, identical or equivalent components are indicated by the same numerals.

DETAILED DESCRIPTION OF THE INVENTION

Figure 1:
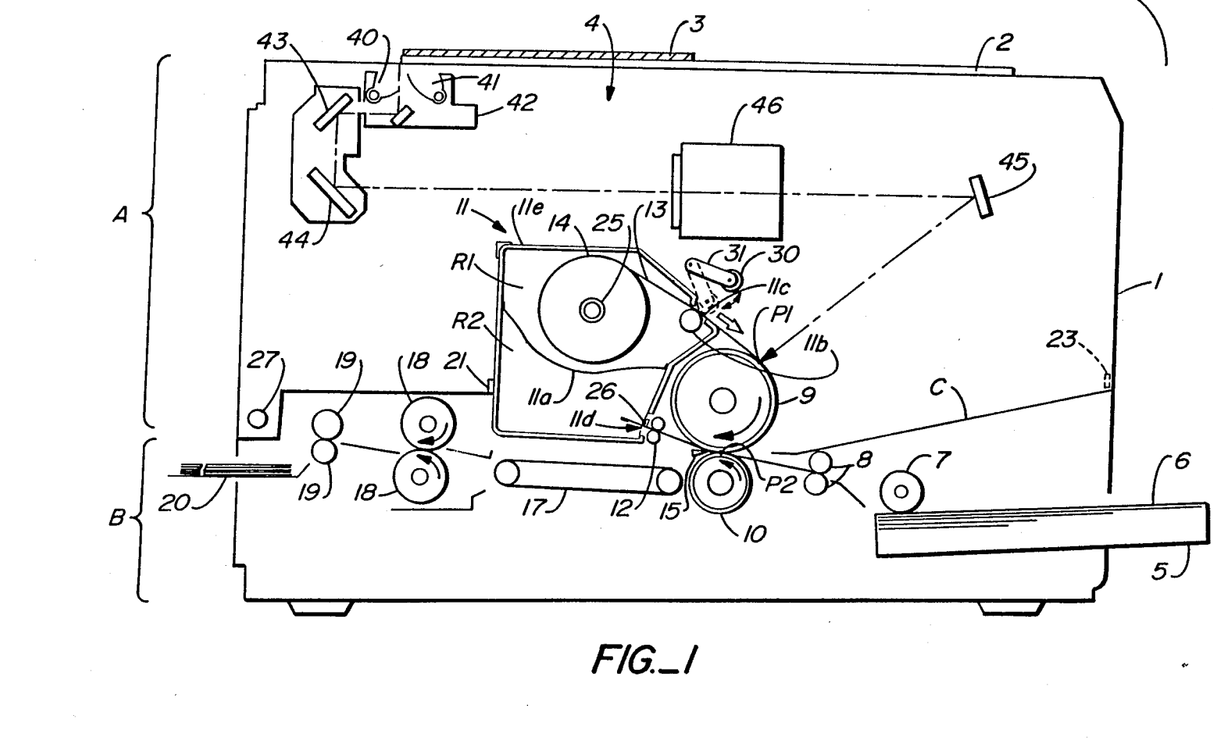
FIG. 1 is a schematic front sectional view of an image formation apparatus embodying the present invention to show its internal structure.

FIG. 1 shows the structure of an image formation apparatus embodying the present invention adapted to use a photosensitive sheet of the kind comprising a base sheet coated with microcapsules encapsulating a colorless dye and a photopolymerizing monomar. A document table 2 is provided at the top of a housing structure 1 and an original document 3 to be copied placed on top of the document table 2 is scanned by an optical system 4 of a known kind comprised of two source lamps 40 and 41, reflective mirrors 42–45 and a lens 46. At the lower right-hand part of the housing structure 1 is a paper cassette 5 containing image transfer sheets 6. A feeder roller 7 serves to transport the transfer sheets 6 one sheet at a time to compression section through guiding rollers 8.

Nearly at the center of the housing structure 1 is a main drum 9 which serves as the upper one of a pair of compression rollers. Below the main drum 9 and opposite thereto is a pressure applying roller 10 which serves as the lower one of the pair of compression rollers. A cartridge 9 embodying the present invention containing therein a roll of photosensitive sheet 13 is detachably attached to the housing structure 1 somewhat above and to the left of the main drum 9. During operation of the image formation apparatus, the photosensitive sheet supplied from the cartridge 11 is wound half-way around the main drum 9. A point on the upper right-hand side of the surface of the main drum 9 indicated by P1 is an exposure point where image forming light reflected from the document 3 is directed and focused by the optical system 4. The point at which the main drum 9 and the pressure applying roller 10 contact each other is defined as the pressure point P2 where the photosensitive sheet 13 and one of the transfer sheets 6 are superposed one on top of the other and sandwiched together between the main drum 9 and the pressure applying roller 10. A blade 15 is disposed on the left-hand side of the pressure point P2 and serves to separate the photosensitive sheet 13 and the transfer sheet 6 after they pass through the pressure point P2, sending the transfer sheet 6 alone downward.

To the left of the blade 15 is a conveyor belt 17. To the left of the conveyor belt 17 are heat rollers 18, discharge rollers 19 and a discharge tray 20 in this order. The transfer sheet 6 separated by the blade 15 is transported by the conveyor belt 17 to the left and brought to the heat rollers 18 which serve to give luster to the visible image formed on the transfer sheet 6. The transfer sheet 6 is coated not only with a developer material but also with a thermoplastic resin which melts by the heat of the heat rollers 18 as the image carrying transfer sheet 6 passes therethrough and makes a uniform surface over the image. This technology has already been disclosed, for example, in Japanese Patent Publication Tokkai No. 60-259490. After passing through the heat rollers 18, the transfer sheet 6 is discharged onto the discharge tray 20 by the discharge rollers 19.

In the meantime, the photosensitive sheet, after passing the pressure point P2, passes between cartridge inlet rollers 12 and is discharged into the cartridge 11. As will be described more fully below, the interior of the cartridge 11 is divided by a light-screening flexible partition 11a into an upper chamber R1 for containing an unused sheet and a lower chamber R2 for storing used parts of the photosensitive sheet. The cartridge 11 is provided with an outlet 11c on its upper right-hand side and an inlet 11d on its lower right-hand side. At the outlet 11c is a roller 11b partially exposed to the exterior of its housing to serve as the lower one of a pair of delivery rollers. Another roller 30 which serves as the upper one of the delivery rollers is disposed opposite to the lower delivery roller 11b and rotatably supported by arms 31 (only the front one visible in FIG. 1) which, in turn, are rotatably supported by the housing structure 1 so as to be movable as indicated by a double-headed arrow. The upper delivery roller 30 is in motion-communicating relationship with a power source in the housing structure 1 such that, when it is in the position shown by broken lines in FIG. 1, the photosensitive sheet 13 is sandwiched between the delivery rollers 30 and 11b and is delivered in the direction of a double arrow by the rotation thereof. As will be explained more fully below, the upper delivery roller 30 assumes the position of the broken lines only during a specified period of time after the cartridge 11 is set to the housing structure 1 of the image formation apparatus such that only the front end part of the photosensitive sheet not coated with microcapsules is pulled out from a roll 14 through the outlet 11c by a specified distance determined by the length of the uncoated leader section. The front end is thereafter wrapped around the main drum 9, passed between the cartridge inlet rollers 12 and directed into the lower chamber R2 of the cartridge 11 through its inlet 11d. After the front end of the photosensitive sheet 13 is pulled out of the outlet 11c by the aforementioned specified distance, the upper delivery roller 30 is lifted to the position shown by solid lines in FIG. 1 so as not to contact the microcapsule-coated surface of the photosensitive sheet to apply any pressure thereon.

Figure 2:
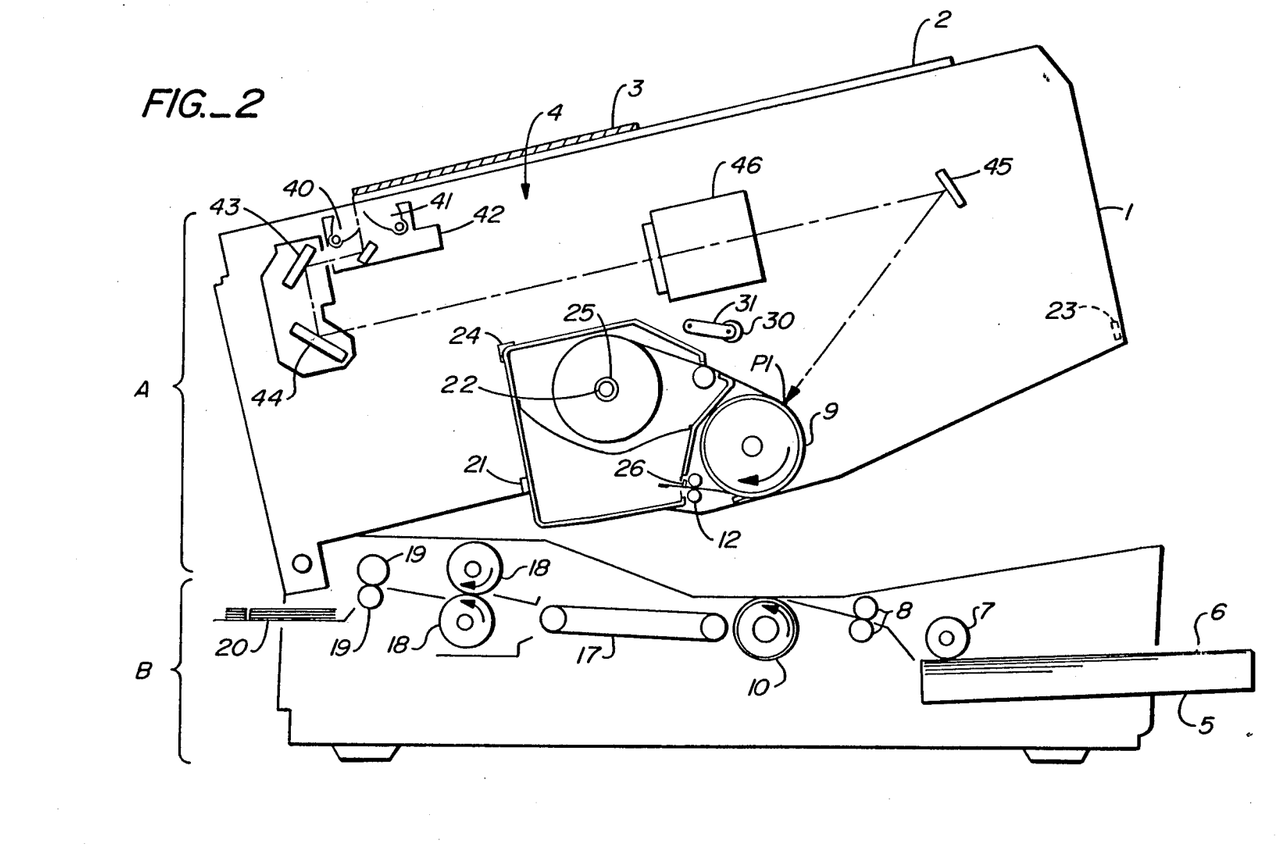
FIG. 2 is a schematic front sectional view of the image formation apparatus of FIG. 1 when its upper unit is open, FIG. 3 schematic front sectional view of the image formation apparatus of claim 1 when its upper unit is open before the cartridge is set, FIG. 4 a sectional front view of a cartridge embodying the present invention.
Figure 3:
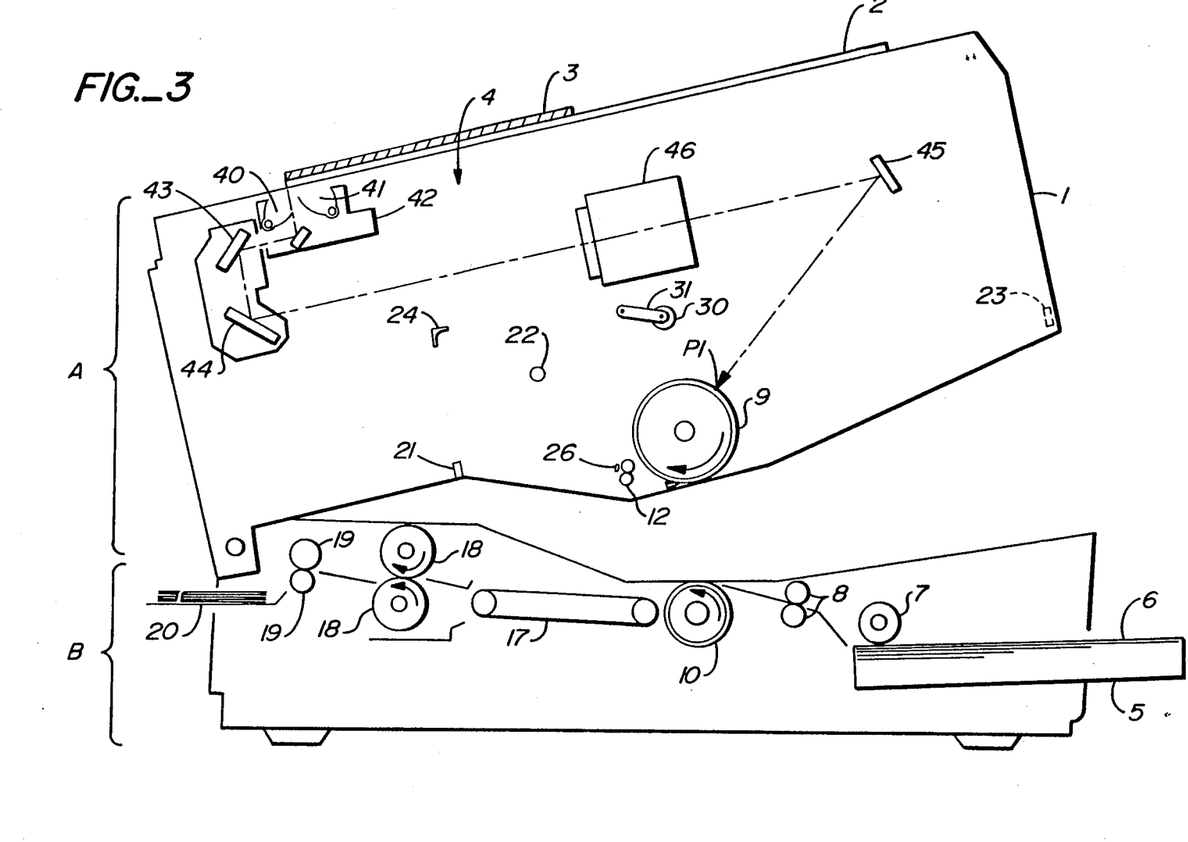

The housing structure 1 consists basically of an upper unit A and a lower unit B such that the upper unit A can be opened and closed rotatably with respect to the lower unit B around a pin 27. The upper unit A contains the main drum 9 and the cartridge 11 while the lower unit B contains the pressure applying roller 10 and the components for transporting the image transfer sheets 6. When it is desired to set the cartridge 11 into the housing structure 1, the upper unit A is opened as shown in FIG. 2 with respect to the lower unit B and a front panel (not shown) is opened. FIG. 3 shows the interior of the housing structure 1 before the cartridge 11 is set. As shown, an axis 22 is attached to the upper unit A perpendicularly to the page and there is also provided a cartridge detector sensor 21 for detecting whether the cartridge 11 has been set properly. A positioning protrusion 24 is also formed on the upper unit A above and to the left of the axis 22. In order to set the cartridge 11 to the upper unit A, a tubular shaft (to be described more fully below) at the center of the row 11 is allowed to be penetrated by the axis 22 and the top left-hand edge of the cartridge housing is matched against the positioning protrusion 24. The cartridge detector sensor 21 is switched on only if the cartridge 11 is properly set to the upper unit A and the control unit (to be described more fully below) of the image formation apparatus starts to rotate the delivery rollers 30 and 11b only upon learning that the cartridge 11 has been properly set by receiving a signal from the sensor 21. Another sensor 23 for detecting whether the upper unit A is open with respect to the lower unit B is disposed at the lower right-hand end of the upper unit A. A still another sensor 26 is provided immediately behind the cartridge inlet rollers 12 for detecting the position of the incoming photosensitive sheet 13.

The main drum 9 is started when a start switch on a control panel (not shown) is operated after the photosensitive sheet 13 is already wrapped therearound. Rotation of the main drum 9 causes the photosensitive sheet 13 to be pulled out of the cartridge 11, exposed to the image forming light from the document 3 at the exposure point P1 and brought to the pressure point P2. At the exposure point P1, the photopolymerizing monomer inside those of the microcapsules exposed to light corresponding to a white area of the document 3 undergoes a polymerization reaction, hardening these exposed capsules selectively. The capsules at positions corresponding to black areas of the document 3 remaining soft, an invisible image, or a pattern, is thereby formed on the photosensitive sheet 13. At the pressure point P2, the photosensitive sheet 13 carrying this invisible image is pressed together with the transfer sheet 6 and a visible image is transferred onto the transfer image 6 by chromogenic reaction of the dye flowing out of ruptured microcapsules as described above and known by persons skilled in the art.

After the image is thus transferred, the photosensitive sheet 13 is discharged through the cartridge inlet rollers 12 back into the cartridge 11 while the transfer sheet 6 now carrying a visible image thereon is separated from the photosensitive sheet 13 by the blade 15 and is transported to the heat rollers 18 by which a lustrous surface is formed thereon before the transfer sheet 6 is discharged onto the discharge tray 20.

Figure 4:
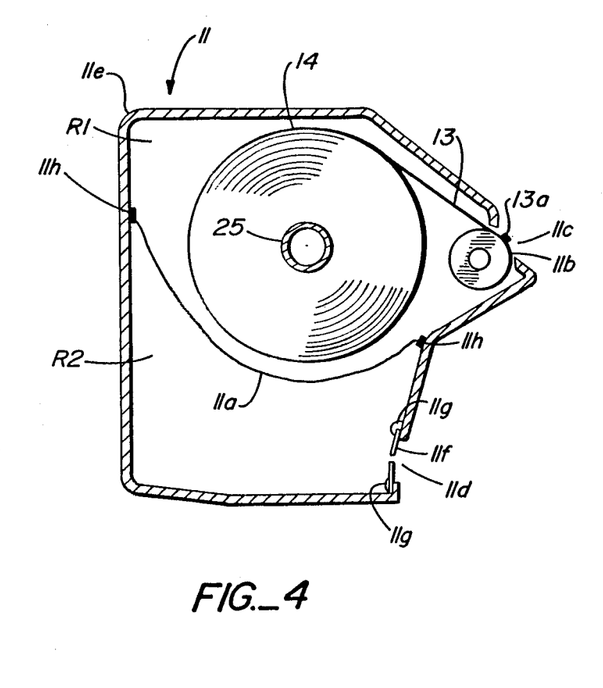

The cartridge 11 is structured, as shown more in detail in FIG. 4, with a tubular shaft 25 carrying a roll 14 of photosensitive sheet 13 inside its housing 11e, the lower delivery roller 11b and the light-screening flexible partition 11a which divides the interior of the cartridge 11 into upper and lower chambers R1 and R2 as briefly described above. The inlet 11d into the lower chamber R2 is provided with shutters 11f from above and below. The partition 11a may be a black polyethylene or paper sheet and is affixed at both ends to inner walls of the cartridge 11 by means of fixing pieces 11h so as to envelope the lower half of the sheet roll 14.

A protrusion 13a is formed at the front edge of the photosensitive sheet 13 unwound from the roll 14. A front end portion of the photosensitive sheet 13 with a specified length L from this protrusion 13a is made of a relatively stiff material and is not coated with microcapsules. This portion is what was referred above as the leader section. Before the cartridge 11 is set to the housing structure 1, the protrusion 13a at the front edge of the photosensitive sheet is exactly at the position of the delivery roller 11b with the leader section in contact with the upper surface of this delivery roller 11b. Since the leader section is relatively stiff, it does not sag but maintains a straight position as shown in FIG. 4. The lower delivery roller 11b is partially exposed to the exterior through the opening 11c formed in the housing 11e and the protrusion 13a at the front edge of the leader section of the photosensitive sheet 13 is also exposed through this opening 11c to the exterior opposite to the upper delivery roller 30.

Figure 5:
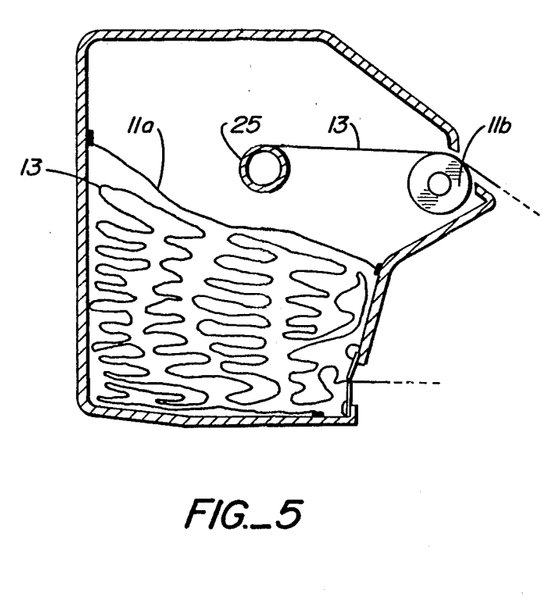
FIG. 5 is a sectional front view of the cartridge of FIG. 4 when the photosensitive sheet therein is nearly completely used up.

The lower chamber R2 of the cartridge 11 serves to store the used portion of the photosensitive sheet 13 brought in through the inlet 11d. The two shutters 11f at this inlet 11d are rotatably supported by axes 11g such that the photosensitive sheet 13, once brought inside, does not go outside again through the same inlet 11d. FIG. 5 shows the condition of the interior of the cartridge 11 when the roll 14 of photosensitive 13 is nearly completely used up and a major portion thereof is already inside the lower chamber R2 of the cartridge 11. In a situation like this, the lower chamber R2 must be large enough to accommodate a large bulk of the photosensitive sheet 13 but since the partition 11a separating the upper and lower chambers R1 and R2 is flexible and is long enough to initially sag at the center, it is automatically pushed upward as the lower chamber R2 is filled up. In the meantime, since the volume required for the upper chamber R1 keeps diminishing as the roll 14 is used up, the partition 11a is not prevented from being pushed upward. In summary, the cartridge 11 according to the present invention is characterized as having a flexible partition sheet inside to separate the two chambers formed therein such that the space inside the cartridge 11 can be effectively used both for protecting a roll of unused sensitive sheet and for storing used portions thereof. In other words, there is no need to reserve a large space separately for storing used sheet and the housing structure is allowed to be compactly designed.

When the upper unit A is opened as shown in FIG. 2, the cartridge 11 becomes tilted and this has the favorable effect of pushing used portions of photosensitive sheet to the deeper (left-hand) end of the lower chamber R2 by gravity. Thus, portions of used photosensitive sheet just brought into the lower chamber R2 are moved deeper inside the lower chamber R2 and the space therein can be more effectively utilized for accepting later-coming used portions. FIG. 5 shows the used portions nearly uniformly distributed inside the lower chamber R2 after the upper unit A is opened and closed many times. When the upper unit A is opened as shown in FIG. 3, furthermore, the pressure applying roller 10 becomes automatically separated from the main drum 9, thereby allowing the user to remove a jammed sheet at the pressure point P2, if there is a jam.

The upper delivery roller 30, which was only sketchily described above, and its mechanism for operation are explained next more fully with reference to FIG. 6. The upper delivery roller 30 is approximately of the same length as the width of the photosensitive sheet 13 and is affixed to an axis 32 attached to end parts of the arms 31 which are rotatably supported by another axis 33. A gear 34 engaged with a driving gear 35 provided to the housing structure 1 of the image formation apparatus is attached to one end of this axis 33. Actuators of solenoids 36 are attached to the distal ends of the arms 31 away from the roller 30. Rollers 37 and 38 are respectively fastened to the axes 33 and 32, and endless belts 39 are stretched therebetween. The ends of the arms 31 where the delivery roller 30 is attached are upwardly raised by springs 50.

Figure 6:
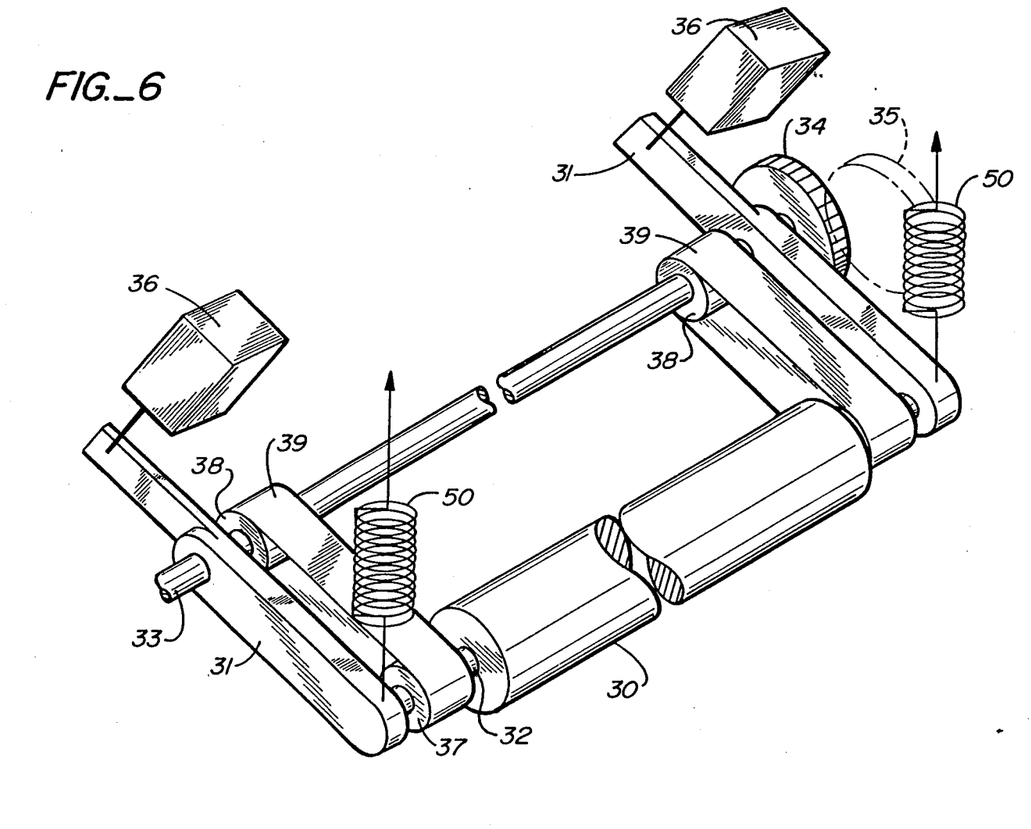
FIG. 6 is a diagonal view of a mechanism for controlling the delivery roller.

With a mechanism thus assembled as shown in FIG. 6, the delivery roller 30 is normally lifted as shown by solid lines in FIG. 1 because of the springs 50. When the solenoids 36 are switched on, however, the arms 31 are rotated in the clockwise direction until the roller 30 assumes the position indicated by broken lines in FIG. 1 and contacts the lower conveyor roller 11b if the cartridge 11 is set. Thus, if the photosensitive sheet 13 is already sandwiched therebetween, it can be pulled out of the cartridge 11 automatically. The roller 30 is moved by communicating the motion of the gear 34 through the belts 39. As will be explained more fully below, the motion of the roller 30 for pulling out the photosensitive sheet 13 is started after both the cartridge detector sensor 21 and the upper-unit detector sensor 23 are switched on and stopped when the sheet sensor 26 detects the front edge of the photosensitive sheet 13 (or by waiting a specified length of time thereafter) as the solenoids 36 are switched off.

Figure 7:
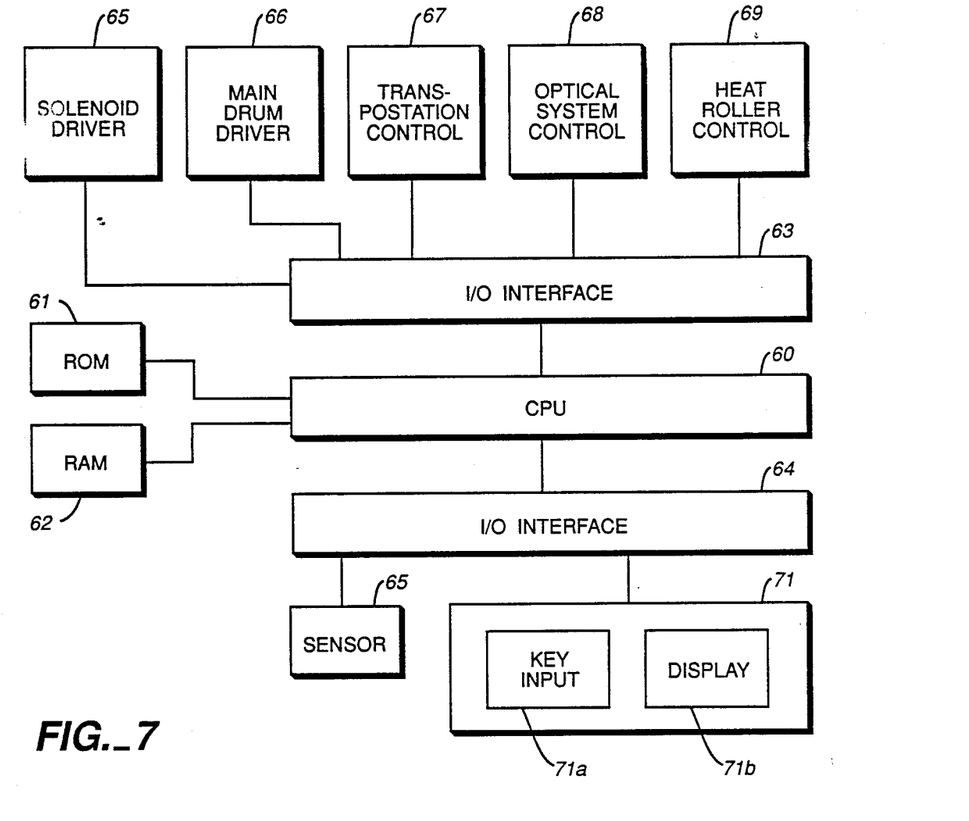
FIG. 7 is a block diagram of a control unit for the image formation apparatus of FIG. 1.

The image formation apparatus described above is controlled as shown in the block diagram of its control unit by a central processing unit CPU 60 which is connected to a read-only memory ROM 61, a random-access memory RAM 62 and input/output interface circuits 63 and 64. The I/0 interface 63 is connected to a driver 65 for the solenoids 36, a driver 66 for the main drum 9, a control unit 67 for the transportation of transfer sheets 6, a control unit 68 for the optical system 4 and a control unit 69 for the heat rollers 18, fans and the like. The I/0 interface 64 is connected to detector sensors 70 including the aforementioned cartridge detector sensor 21, upper-unit detector sensor 23 and sheet sensor 26, and a control panel 71 inclusive of a key-input section 71a and a display device 71b.

Operation by the CPU 60 when the cartridge 11 is set is explained next with reference to the flow chart of FIG. 8 which starts when the front panel of the image formation apparatus is opened and the upper unit A is lifted. If the cartridge detector sensor 21 is on (YES in n1), this means either that a new cartridge has been set or that an old cartridge is still available. In either situation, the condition of the photosensitive sheet 13 as reported by the sheet sensor 26 is examined next (n2). If the sheet sensor 26 is off, this means that a new cartridge 11 has just been set. If the sheet sensor 26 is on, the image formation apparatus is ready to be used and there is nothing required to be done. If the cartridge 11 now set is a new one, the control unit waits until the upper unit A is closed and this is detected by the upper-unit detector sensor 23 (YES in n3). Alternatively, the sensor 23 maybe designed to be switched on when both the upper unit A and the front panel of the image formation apparatus are closed. Alternatively still, closing of the front panel need not be made a condition for advancing to Step n4.

After a few seconds (n4), a timer $t_1$ assigned to the RAM 62 is reset (n5), the solenoids 36 are switched on and the delivery roller 30, the main drum 9, the pressure applying roller 10 and the cartridge inlet rollers 12 are operated (n6). This causes the leader section of the photosensitive sheet 13 to be pulled out of the cartridge 11, passes over the surface of the main drum 9 and through the pressure point P2 and brought to the exit of the cartridge inlet roller 12 so as to switch on the sheet sensor 26 (n7). When the sheet sensor 26 is switched on, a second timer $t_2$ also assigned to the RAM 62 is reset, the solenoids 36 are switched off and the delivery roller 30 are stopped (n10). After the second timer $t_2$ counts up a predetermined length of time $T_2$ (n11), operations of the main drum 9, the pressure applying roller 10 and the cartridge inlet rollers 12 are stopped (n12).

Figure 9:
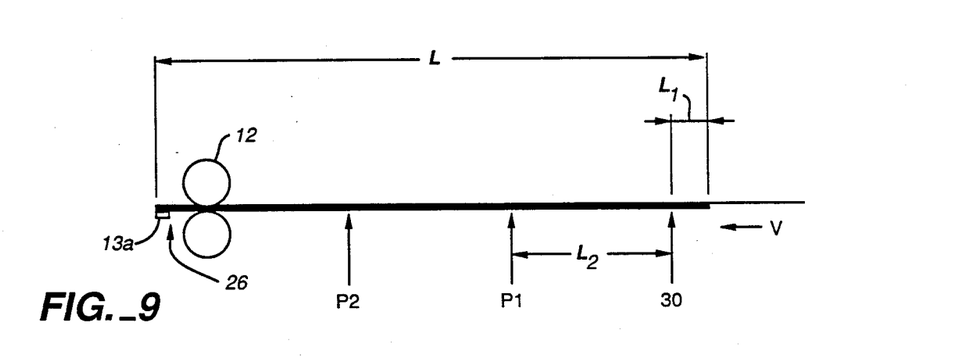
FIG. 9 is a drawing for showing the positional relationships of points on the leader section of the photosensitive sheet.

The aforementioned time interval $T_2$ is determined as follows. As shown in FIG. 9, which illustrates positional relationships among points traveled through by the photosensitive sheet 13, the total length L of the relatively stiff leader section at the front of the photosensitive sheet 13 is made somewhat (by an extra length of $L_1 = 1-3$ cm) longer than the distance between the position of the sheet sensor 26 and that of the delivery roller 30. Thus, the photosensitive sheet 13 must travel at least a distance of $(L_1+L_2)$ after the protrusion 13a at its front end is detected by the sheet sensor 26 such that a microcapsule-coated part of the photosensitive sheet 13 is sure to be at the exposure point Pl, where $L_2$ represents the distance between the position of the delivery roller 30 and the exposure point Pl. Thus, if V is the speed of the photosensitive sheet 13 at which it is advanced, the time interval $T_2$ should be determined by $(L_1+L_2)/V$.

Figure 8:
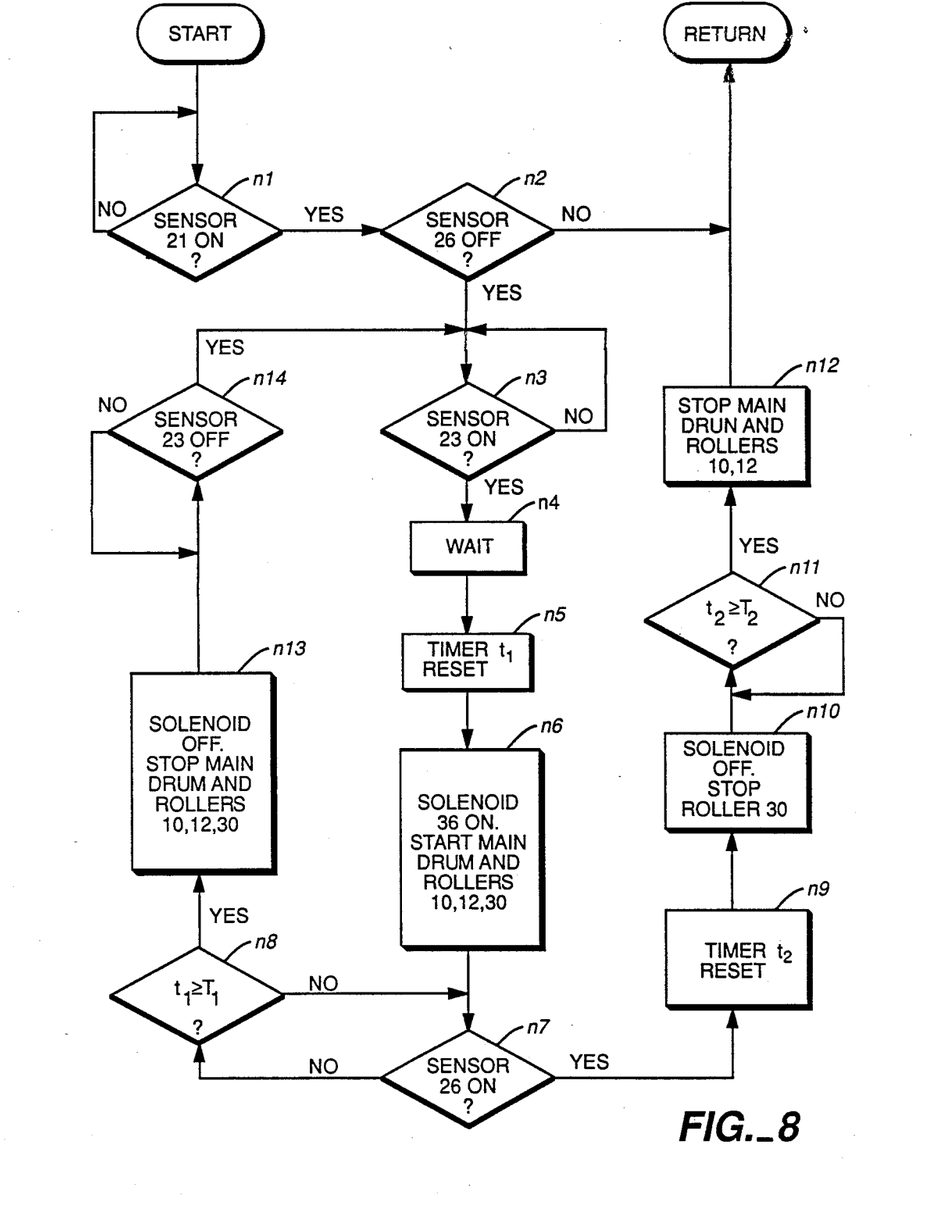
FIG. 8 is a flow chart for the operation of the CPU of FIG. 7 when the cartridge is set.

With reference again to the flow chart of FIG. 8, if the sheet sensor 26 is not switched on (NO in n7) after an elapse of a preset time period $T_1$ which should be sufficient for the front edge of the photosensitive sheet 13 to reach the position of the sheet sensor 26 (YES in n8), this indicates that the photosensitive sheet 13 is somehow not being pulled out of the cartridge 11. Thus all operations of the solenoids 26, the delivery roller 30, the main drum 9, the pressure applying roller 10 and the cartridge inlet rollers 12 are stopped (n13) and after the upper unit A is opened (YES in n14), operations from Step n3 are repeated.

In summary, after a new cartridge 11 is set, the delivery roller 30 cooperates with another roller 11b inside the cartridge 11 to automatically pull out the relatively stiff leader section at the front end of the photosensitive sheet 13 until its front edge comes to the position of the cartridge inlet rollers 12. The delivery roller 30 is then lifted so as not to apply any pressure on the microcapsules with which the following part of the photosensitive sheet 13 is coated. The photosensitive sheet 13 is thereafter advanced by the rotation of the main drum 9, the pressure applying roller 10 and the cartridge inlet rollers 12 until the microcapsule-coated part reaches the exposure point Pl. During an image formation process, the photosensitive sheet 13 is likewise advanced by the main drum 9 and the pressure applying roller 10, and since its surface does not contact any roller until it reaches the pressure point P2, the microcapsules thereon are well protected. Since the back end of the photosensitive sheet 13 is merely lightly attached to the shaft 25 and can be easily removed therefrom, the photosensitive sheet 13 can be used effectively without any waste. When the photosensitive sheet 13 is used up, it is completely stored inside the lower chamber R2 of the cartridge 11 and no part thereof remains outside when the cartridge 11 is taken out of the housing structure 1. Thus, there is no danger of leakage of residual dye.

The foregoing description of a preferred embodiment of the invention has been presented for purposes of illustration and description. It is not intended to be exhaustive or to limit the invention to the precise form disclosed, and many modifications and variations are possible in light of the above teaching. With reference to the flow chart of FIG. 8, for example, the rotation of the delivery roller 30 need not be stopped by a signal from the sheet sensor 26. Instead, the delivery roller 30 may be programmed to stop after a predetermined time period estimated to be sufficient for the front edge of the photosensitive sheet 13 to reach the position of the sheet sensor 26.

Figure 10:
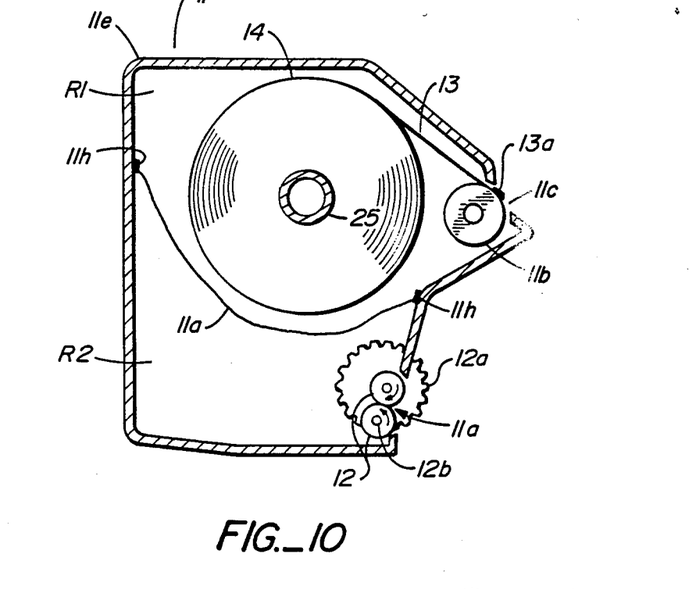
FIG. 10 is a schematic sectional front view of another cartridge embodying the present invention.
Figure 11:
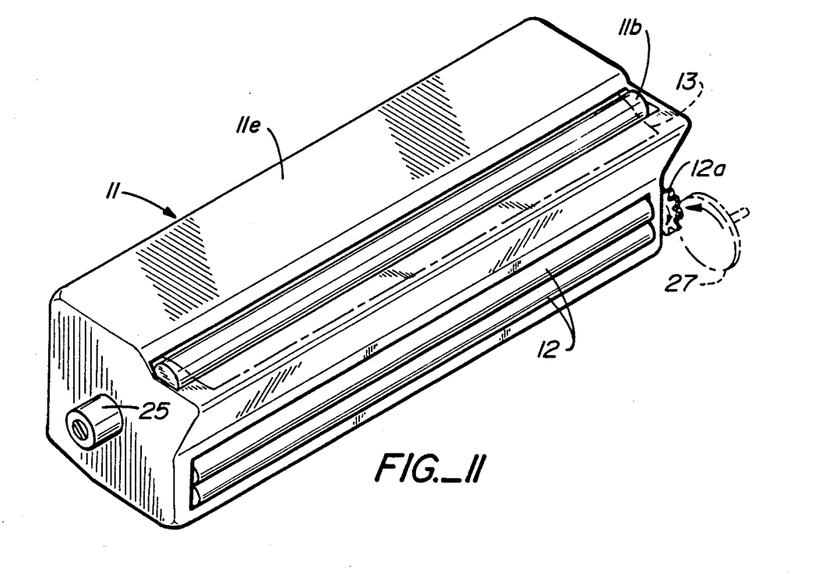
FIG. 11 is a diagonal view of the cartridge of FIG. 10.

Structurally, the cartridge inlet rollers 12 need not be disposed outside the cartridge housing 11e. FIGS. 10 and 11 show another cartridge embodying the present invention characterized as having a pair of inlet rollers 12 inside its inlet opening 11d with a gear 12a attached to the upper one thereof disposed outside the housing 11e. A driver gear 27 is supported by the housing structure 1 of the image formation apparatus so as to engage with this eternally positioned gear 12a when the cartridge 1 is set. The lower one of the inlet rollers 12 is pressed upward by a plate spring 12b. Since this pair of inlet rollers 12 nearly completely cover the inlet 11d and since they can rotate only in the directions of the arrows shown thereon, the photosensitive sheet 13, once inside, is more strictly prevented from coming out of the lower chamber R2.

If the cartridge 11 shown in FIGS. 1-4 is replaced by the one shown in FIGS. 10 and 11, the timing schedule illustrated by way of the flow chart of FIG. 8 may be modified appropriately but such modifications and variations are apparent to a person skilled in the art and are intended to be included within the scope of this invention.

What is claimed is:

1. An image formation apparatus comprising
a cartridge having an outlet and containing a rolled photosensitive sheet, a roller disposed near said outlet for contacting said photosensitive sheet to thereby pull said photosensitive sheet out of said cartridge,
a sensor for outputting a detection signal when said cartridge is detected as being set in said image formation apparatus, and
driving means for driving said roller in response to said detection signal until a predefined condition comes to be satisfied.

2. The apparatus of claim 1 wherein said driving means drives said roller in response to said detection signal for a predetermined period of time.

3. The apparatus of claim 1 wherein said driving means drives said roller in response to said detection signal until a specified length of said photosensitive sheet is pulled out.

4. The apparatus of claim 1 further comprising means for separating said roller from said photosensitive sheet when a predetermined length of said photosensitive sheet has been pulled out of said cartridge by said roller.

5. The apparatus of claim 1 wherein said cartridge contains an internal roller near said outlet, a part of said internal roller being exposed externally and said photosensitive sheet contacting said externally exposed part of said internal roller.

6. The apparatus of claim 1 wherein said cartridge includes a flexible partitioning means which partitions the interior of said cartridge into a first chamber containing unused portion of said photosensitive sheet and a second chamber for containing used portion of said photosensitive sheet, said outlet leading out of said first chamber, said cartridge further having an inlet into said second chamber for passing said used portion of said photosensitive sheet inward therethrough from outside.

7. The apparatus of claim 1 wherein said cartridge also has an inlet for passing used portion of said photosensitive sheet therethrough from outside, said image formation apparatus further comprising a pair of inlet rollers at said inlet for passing said photosensitive sheet therebetween into said housing, and motion communicating means for communicating driving power from an external power source to said inlet rollers.

8. An image formation apparatus comprising
a cartridge having an outlet and containing a rolled photosensitive sheet,
a roller disposed near said outlet for contacting said photosensitive sheet to thereby pull said photosensitive sheet out of said cartridge, and
means for separating said roller from said photosensitive sheet when a predefined length of said photosensitive sheet has been pulled out of said cartridge.

9. The apparatus of claim 8 wherein said cartridge contains an internal roller near said outlet, a part of said internal roller being exposed externally and said photosensitive sheet contacting said externally exposed part of said internal roller.

10. The apparatus of claim 8 wherein said cartridge includes a flexible partitioning means which partitions the interior of said cartridge into a first chamber containing unused portion of said photosensitive sheet and a second chamber containing used portion of said photosensitive sheet, said outlet leading out of said first chamber, said cartridge further having an inlet into said second chamber for passing said used portion of said photosensitive sheet inward therethrough from outside.

11. The apparatus of claim 8 wherein said cartridge also has an inlet for passing said used portion of said photosensitive sheet therethrough from outside, said image formation apparatus further comprising a pair of inlet rollers at said inlet for passing said photosensitive sheet therebetween into said housing, and motion communicating means for communicating driving power from an external power source to said inlet rollers.

12. A cartridge containing a rolled photosensitive sheet comprising
a housing having an outlet for said photosensitive sheet, and
a single roller disposed inside said housing and at said outlet, a part of said roller being exposed externally and said photosensitive sheet contacting said externally exposed part of said roller.

13. The cartridge of claim 12 further comprising a flexible partitioning means inside said housing, said partitioning means partitioning the interior of said housing into a first chamber containing unused portion of said photosensitive sheet and a second chamber for containing used portion of said photosensitive sheet, said outlet being formed to said first chamber and said housing further having an inlet into said second chamber.

14. The cartridge of claim 12 wherein said housing is further formed with an inlet, said cartridge further comprising a pair of inlet rollers disposed at said inlet for passing used portion of said photosensitive sheet therethrough into said housing, and power communicating means for communicating driving power from an external power source to said inlet rollers.

15. The cartridge of claim 13 further comprising a pair of inlet rollers disposed at said inlet for passing used portion of said photosensitive sheet therebetween into said housing, and power communicating means for communicating driving power from an external power source to said inlet rollers.

16. The cartridge of claim 1 wherein said single roller substantially entirely covers said outlet.

17. A cartridge containing a rolled photosensitive sheet comprising
a housing,
a flexible partitioning means inside said housing, said partitioning means partitioning the interior of said housing into a first chamber containing unused portion of said photosensitive sheet and a second chamber for containing used portion of said photosensitive sheet, said housing being formed with an outlet from said first chamber for passing photosensitive sheet outward therethrough and an inlet into said second chamber for passing said photosensitive sheet inward therethrough from outside.

18. The cartridge of claim 17 further comprising a pair of inlet rollers disposed at said inlet for passing used portion of said photosensitive sheet therebetween into said housing, and power communicating means for communicating driving power from an external power source to said inlet rollers.

19. A cartridge containing a rolled photosensitive, sheet comprising
a housing formed separately with an outlet opening and an inlet opening for said photosensitive sheet to pass therethrough,
a pair of inlet opening rollers at said inlet for passing said photosensitive sheet therebetween into said housing, and
motion communicating means for communicating driving power from an external power source to said inlet rollers.

20. The cartridge of claim 19 further comprising an outlet roller which is disposed inside said housing and substantially entirely covers said outlet opening, a part of said outlet roller being exposed externally and said photosensitive sheet contacting said externally exposed part of said outlet roller.

* * * * *

UNITED STATES PATENT AND TRADEMARK OFFICE
CERTIFICATE OF CORRECTION

PATENT NO. : 4,914,479
DATED : April 3, 1990
INVENTOR(S) : Mitsuru Ogura, et al.

It is certified that error appears in the above-identified patent and that said Letters Patent is hereby corrected as shown below:

Claim 16, line 1, change "1" to --12--.

Signed and Sealed this

Second Day of July, 1991

Attest:

HARRY F. MANBECK, JR.

*Attesting Officer*      *Commissioner of Patents and Trademarks*